US012183999B2

(12) United States Patent
Zhang et al.

(10) Patent No.: US 12,183,999 B2
(45) Date of Patent: Dec. 31, 2024

(54) SEPARABLE INTERFACE CABLE STRUCTURE FOR HIGH VOLTAGE UNDER-MODULE POWER INPUT

(71) Applicant: INTERNATIONAL BUSINESS MACHINES CORPORATION, Armonk, NY (US)

(72) Inventors: Xin Zhang, Chappaqua, NY (US); Todd Edward Takken, Brewster, NY (US); Yuan Yao, Tarrytown, NY (US); Andrew Ferencz, Southborough, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 119 days.

(21) Appl. No.: 17/555,346

(22) Filed: Dec. 17, 2021

(65) Prior Publication Data

US 2023/0198177 A1 Jun. 22, 2023

(51) Int. Cl.
*H01R 4/04* (2006.01)
*H01R 12/62* (2011.01)
(Continued)

(52) U.S. Cl.
CPC .............. *H01R 12/62* (2013.01); *H01R 4/04* (2013.01); *H05K 1/111* (2013.01); *H05K 3/321* (2013.01);
(Continued)

(58) Field of Classification Search
CPC ........ H01R 12/62; H05K 1/111; H05K 3/321; H05K 2201/10356; H05K 2201/10984;
(Continued)

(56) References Cited

U.S. PATENT DOCUMENTS 5,933,712 A * 8/1999 Bernhardt ........... H01L 23/5387
438/109
6,633,487 B1 10/2003 Toyoshima et al.
(Continued)

FOREIGN PATENT DOCUMENTS

CN 203553412 U 4/2014
EP 3110238 A2 12/2016
(Continued)

OTHER PUBLICATIONS

International Search Report and Written Opinion issued Feb. 24, 2023 in related international patent application No. PCT/EP2022/082278M 13 pgs.

*Primary Examiner* — Steven T Sawyer
(74) *Attorney, Agent, or Firm* — Intelletek Law Group, PLLC; Gabriel Daniel, Esq.

(57) ABSTRACT

A semiconductor package provides a low profile connection to a bottom side of the semi-conductor package. The semiconductor package includes a computer processor die and a substrate. The computer processor die is mounted on to a top surface of the substrate. The substrate is mounted on to a printed circuit board. A voltage regulator is coupled to the printed circuit board. A top surface of the voltage regulator is coupled to a bottom surface of the substrate. The package also includes a connector device. The connector device includes a cable configured to conduct power from an upstream source, and a low-profile connector module attached to an end of the cable. The connector module is configured to interface to a bottom surface of the voltage regulator.

18 Claims, 6 Drawing Sheets

(51) Int. Cl.
*H05K 1/11* (2006.01)
*H05K 3/32* (2006.01)
*H05K 1/02* (2006.01)

(52) U.S. Cl.
CPC . *H05K 1/0262* (2013.01); *H05K 2201/10325* (2013.01); *H05K 2201/10356* (2013.01); *H05K 2201/1053* (2013.01); *H05K 2201/10984* (2013.01)

(58) Field of Classification Search
CPC .............. H05K 1/18; H05K 1/119; H05K 2201/09063; H05K 2201/09072; H05K 2201/10393; H05K 2201/105; H05K 2201/1053; H05K 2201/10545; H05K 2201/10568; H05K 2201/10598; H05K 1/0262; H05K 1/141; H05K 2201/10189; H05K 2201/10325; H05K 1/021; H05K 1/115; H05K 1/181; H01L 23/367; H01L 23/49827; H01L 2224/73253; H01L 23/13; H01L 23/4093; H01L 23/49822; H01L 2224/16225; H01L 25/16; Y02D 10/00

See application file for complete search history.

(56) References Cited

U.S. PATENT DOCUMENTS

| | | |
|---|---|---|
| 9,614,619 B1* | 4/2017 | Shen ................... H04B 10/40 |
| 9,927,833 B2 | 3/2018 | Norton |
| 9,967,511 B2 | 5/2018 | Ritter et al. |
| 2003/0062602 A1* | 4/2003 | Frutschy ........... H01L 23/49805 257/E23.079 |
| 2003/0162442 A1 | 8/2003 | Panella |
| 2005/0057939 A1* | 3/2005 | Mizuyoshi .......... H01L 25/0753 257/E25.02 |
| 2005/0248024 A1 | 11/2005 | Costello |
| 2016/0218094 A1* | 7/2016 | Bruno .................... H01L 23/13 |
| 2017/0139451 A1* | 5/2017 | Chuang .................. G06F 1/20 |
| 2018/0331081 A1* | 11/2018 | Goh ..................... H05K 3/303 |
| 2019/0306977 A1* | 10/2019 | Christo ................. H05K 1/115 |
| 2019/0313534 A1 | 10/2019 | Kapinos et al. |
| 2020/0245464 A1* | 7/2020 | Hattori ................ H01L 23/367 |
| 2023/0335440 A1* | 10/2023 | Ramachandran ....... H01L 22/20 |

FOREIGN PATENT DOCUMENTS

| | | |
|---|---|---|
| EP | 3809572 A1 | 4/2021 |
| WO | 2009114225 A1 | 9/2009 |
| WO | 2012125207 A1 | 9/2012 |

\* cited by examiner

SEPARABLE INTERFACE CABLE STRUCTURE FOR HIGH VOLTAGE UNDER-MODULE POWER INPUT

BACKGROUND

Technical Field

The present disclosure generally relates to electrical devices, and more particularly, to a separable interface cable structure for high voltage under-module power input.

Description of the Related Art

Cloud computing processing board power demands has been increasing in the modern computing systems due to the increasing needs of computation in various applications including machine learning workloads. The task in how to deliver the high current and high voltage demands to a computing processing board is a main challenge for future datacenters and cloud systems.

Conventional processing boards typically use a multi-pin connector package mounted to the top of the board. A female connector module with multiple ports is mounted directed to the board. A power cable includes a multi-pin male connector that is plugged into the female connector housing. The male and female housings are generally bulky and designed with a tall vertical dimension for vertical insertion if the male plug. The higher the power requirements, the larger and bulkier the connector module may be to accommodate higher voltage input. Technicians generally have to remove the entire board to unplug a power connection because the space is too tight and contact with board elements may cause damage. In addition, many boards include a keep out space set aside by the board designer prohibiting external components. The keep out requirement makes the challenge to position a compliant power connection point more formidable.

The power connector is commonly positioned proximate a top side edge of the board occupying valuable board trace space. In some boards, a separate voltage regulator is mounted close to the female connector. The voltage regulator may occupy an additional board footprint. Sometimes the position of the conventional power connector and power cable can interfere with other computing elements in the crowded board environment. As processing board capacities continue to grow, the value of board space for computing resources increases.

SUMMARY

According to an embodiment of the present disclosure, a connector device is disclosed. The connector device includes a cable to conduct power from an upstream source. A low-profile connector module is attached to an end of the cable. The connector module is configured to interface to a bottom side of a voltage regulator. A top side of the voltage regulator is mounted to a semiconductor package.

According to an embodiment of the present disclosure, a connector device is disclosed. The connector device includes a cable configured to conduct a direct current (DC) voltage from an upstream DC converter source. A low-profile connector module is attached to an end of the cable. An electrically conductive adhesive patch is mounted to the connector module. The adhesive patch is configured to interface to a bottom side of a voltage regulator and conduct the DC voltage from the DC converter into the voltage regulator. A top side of the voltage regulator is mounted to a semiconductor package.

According to an embodiment of the present disclosure, a semi-conductor package is disclosed. The semi-conductor package includes a computer processor die and a substrate. The computer processor die is mounted on to a top surface of the substrate. The substrate is mounted on to a printed circuit board. A voltage regulator is coupled to the printed circuit board. A top surface of the voltage regulator is coupled to a bottom surface of the substrate. The package also includes a connector device. The connector device includes a cable configured to conduct power from an upstream source, and a low-profile connector module attached to an end of the cable. The connector module is configured to interface to a bottom surface of the voltage regulator.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

Figure 1:
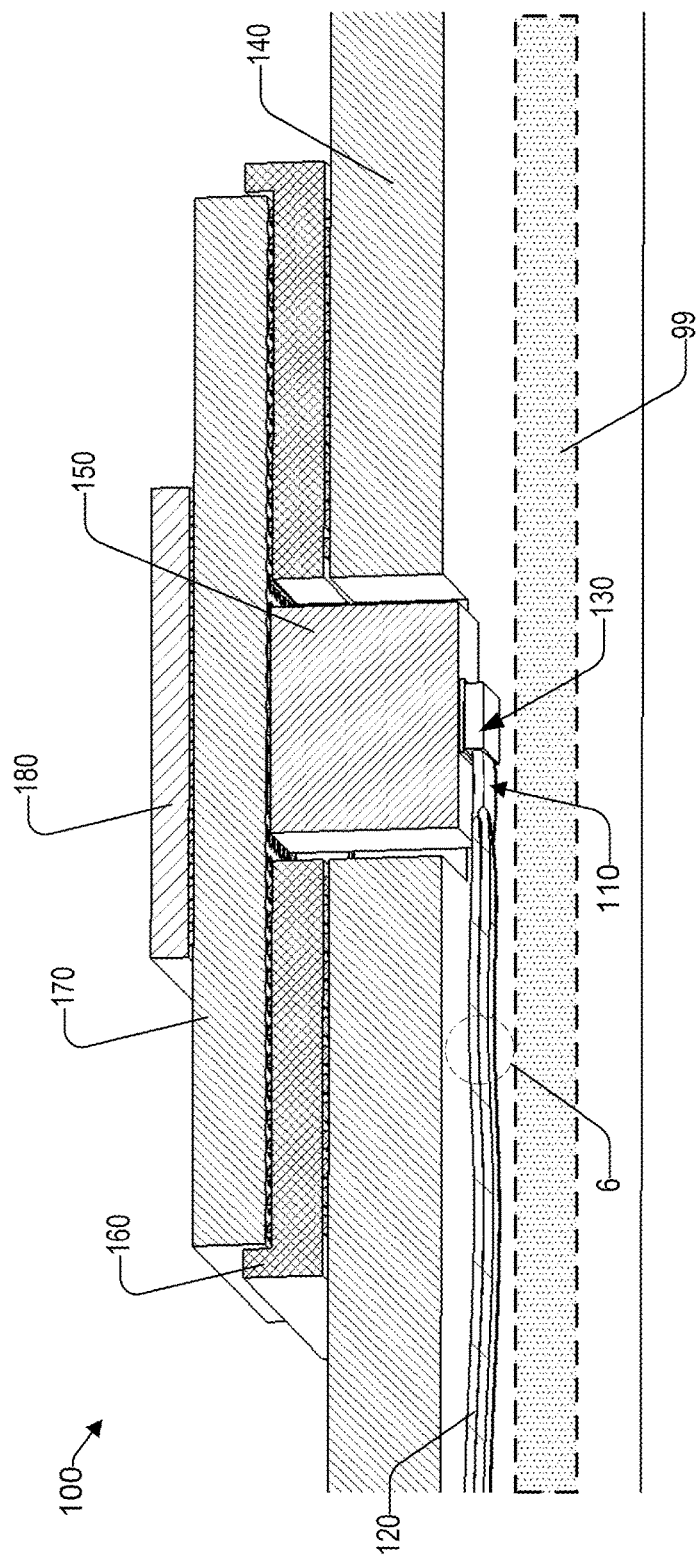
FIG. 1 is a side sectional, bottom perspective view of a semiconductor package including a bottom side cable interface according to an embodiment.
Figure 2:
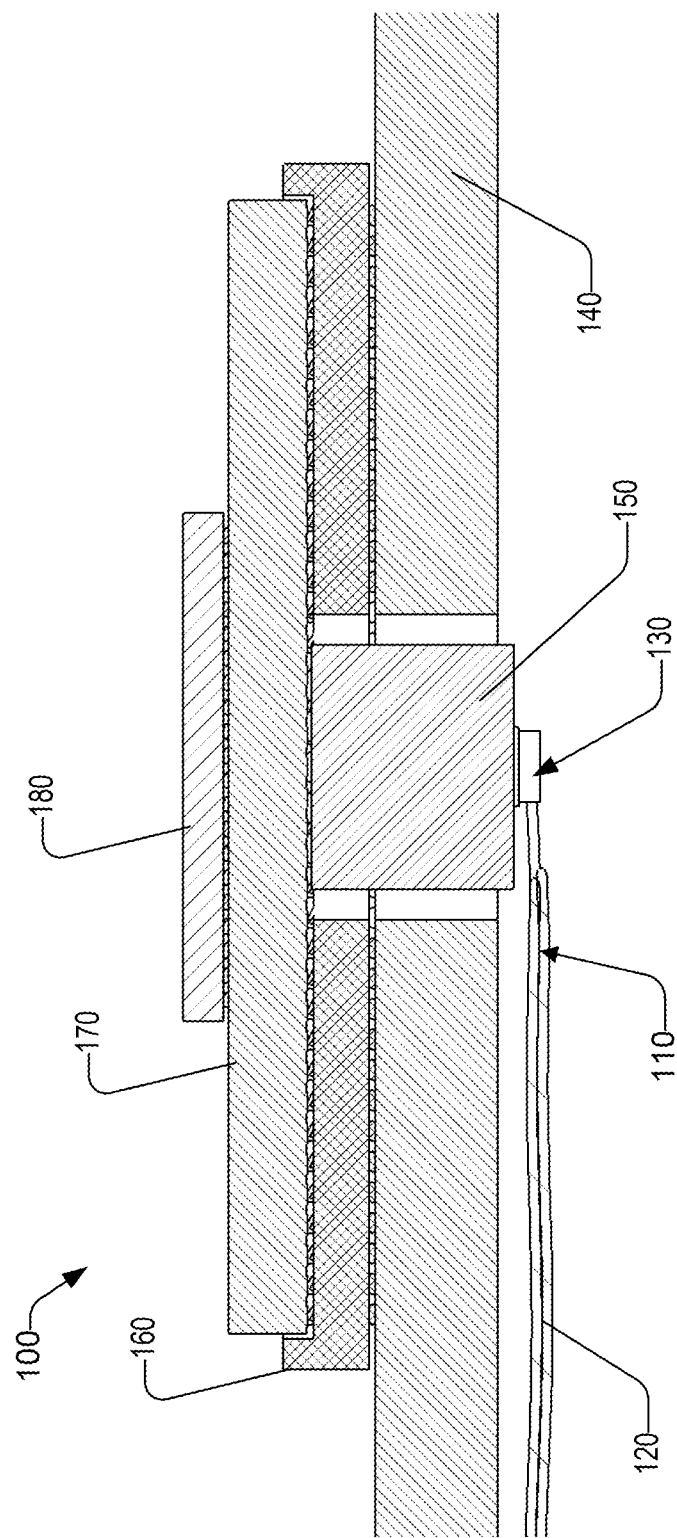
FIG. 2 a side sectional view of the semiconductor package including a bottom side cable interface of FIG. 1, consistent with an illustrative embodiment.
Figure 3:
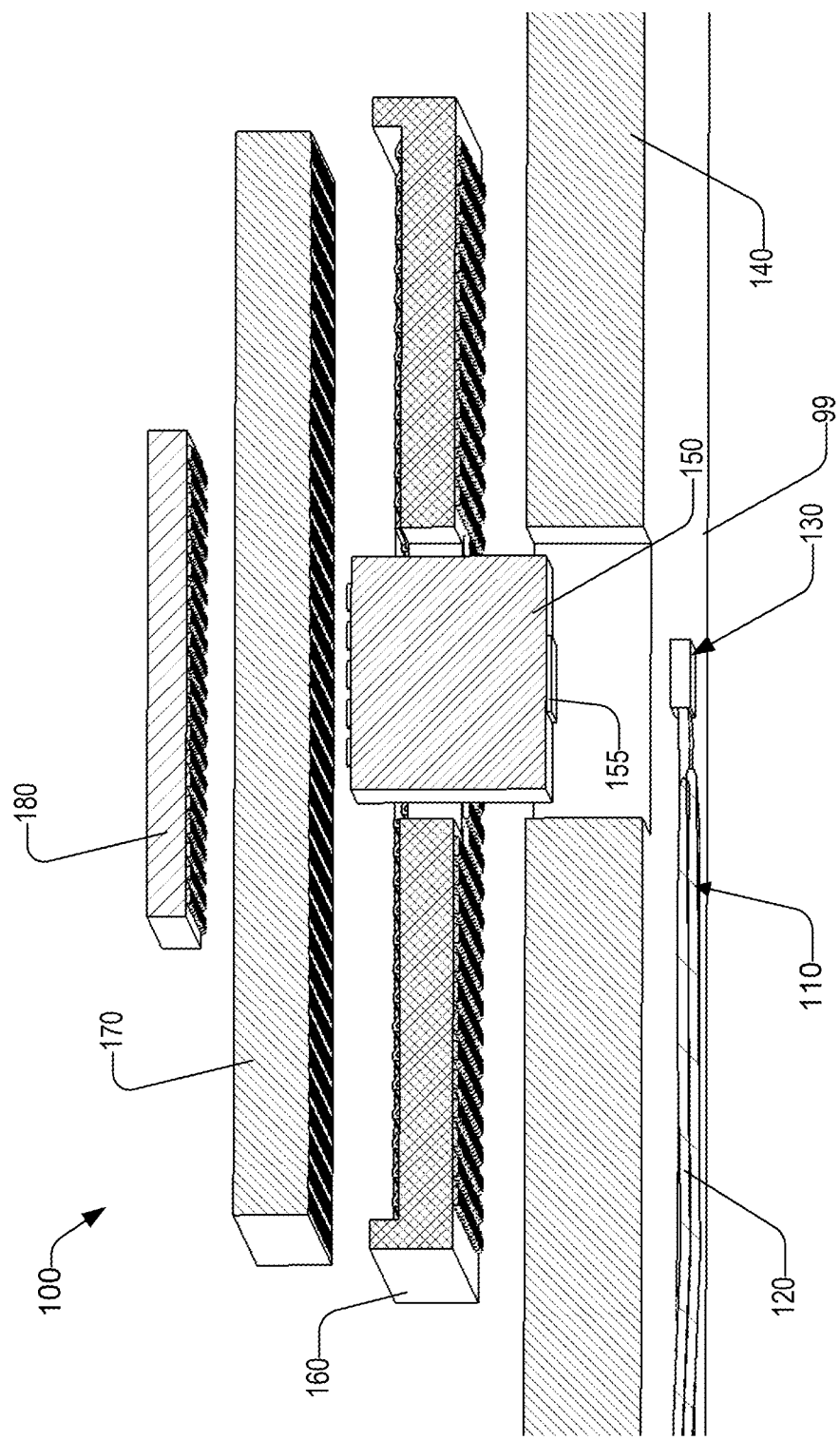
FIG. 3 is an exploded view of FIG. 2, consistent with an illustrative embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure generally relates to electrical connectors for semiconductor packages. In an illustrative embodiment, a motherboard or mezzanine card is shown as an example of the environment for aspects of the subject technology. However, it should be understood that embodiments may extend to other similar processing board environments where limited vertical space is available for electrical connections.

Referring to the Figures in general, embodiments disclose a connector device that provides a space saving structure while delivering high power to a computing processing board. The connector device is attachable from a bottom side of a board. As will be appreciated, aspects of the connector device free up additional board space for processing elements. The connection of auxiliary elements (for example, the power input/out) is moved to a typically unused connection point to the board. It should be further appreciated that in some applications, while the top side of a board has limited and crowded areas to connect to, it is also the case that there is often a limited space under the board in heavy computing environments. For example, there is usually another computing device right under one computing board (which may be, for example, another computing board). Accordingly, there is very little room to fit bulky devices such as conventional connector modules. Aspects of the subject connector device fit within tight clearance space under the board and are easily removable and replaceable. In addition, the subject device is compliant with PCB keep out requirements since these are typically not present on a bottom side of the board.

In another aspect, a novel semi-conductor package is disclosed. The package includes a voltage regulator connected to the bottom side of the board. A power cable attaches to the voltage regulator from underneath the board. Those of ordinary skill in the art will appreciate that the subject semi-conductor package structure is non-obvious since the structure provides increased processing resource space on the top side of the board by utilizing an unconventional connection to the bottom side of the board for power input/output.

Referring now to the Figures, a semi-conductor package 100 is shown according to an illustrative embodiment. The semi-conductor package 100 generally includes a connector device 110 (sometimes referred to simply as the "device 110") coupled to a voltage regulator 150. The semi-conductor package 100 may include a motherboard 140. An LGA socket 160 may be mounted to a top surface of the motherboard 140. A processor die 180 may be mounted to a substrate 170 that is plugged into the LGA socket 160. As a reference point, there may be an underlying external structure 99 that defines a clearance space under the bottom side of the semi-conductor package 100. The clearance space may generally range from 1 mm to 20 mm which should provide some perspective on the access space available from the bottom side of the semi-conductor package 100.

In an illustrative embodiment, the motherboard 140 and the LGA socket 160 each include an opening that are in alignment with one another. Generally, the motherboard and socket openings provide an access way to the substrate 170 from underneath, that is configured to receive the voltage regulator 150 within the space created by the openings. In some embodiments, the motherboard and socket openings may be positioned directly under the processor die 180. The voltage regulator 150 may be mounted through the bottom opening in the motherboard 140 to the bottom side of the substrate 170. In some embodiments, the voltage regulator 150 is aligned directly under the processor die 180 when attached to the substrate 170.

In an illustrative embodiment, the connector device 110 includes a power cable 120 delivering high power voltage from an upstream source (not shown) and a connector module 130. In some embodiments, the connector device 110 is configured for high power DC applications. For example, the upstream source may be delivering power on the order of hundreds of watts. The voltage regulator 150 may be a DC-DC voltage regulator.

Figure 6:
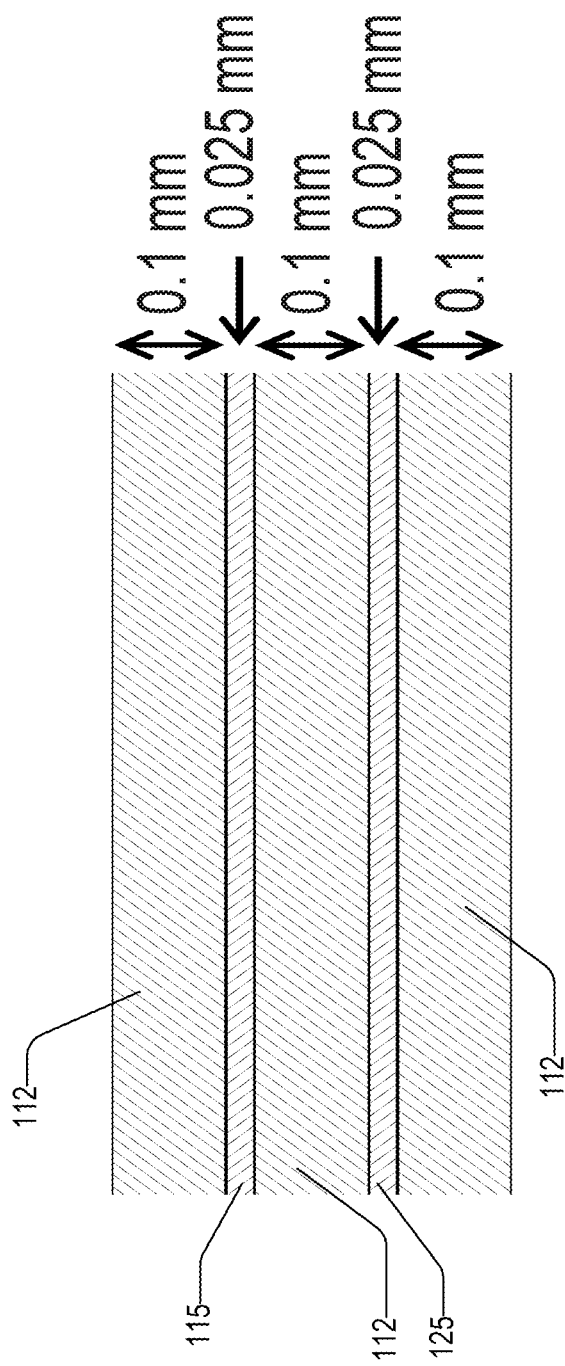
FIG. 6 is an enlarged cross-sectional view of the circle 6 of FIG. 1, consistent with an illustrative embodiment.

Referring temporarily to FIG. 6, an enlarged cross-section of the cable 120 is shown. The cable 120 may comprise a flex circuit, having two overlapping wide layers of conductor. An input line 115 may be shielded by an insulator 112. An output line 125 may also be shielded by the insulator 112. In an illustrative embodiment, each section of insulation 112 is approximately 0.1 mm thick. The input line 115 and output line 125 may be approximately 0.025 mm in thickness as represented by the thickness of the conductor in the side views of 115 and 125. It may be appreciated that the cable 120 is assembled in a way that minimizes parasitic inductance.

Figure 4:
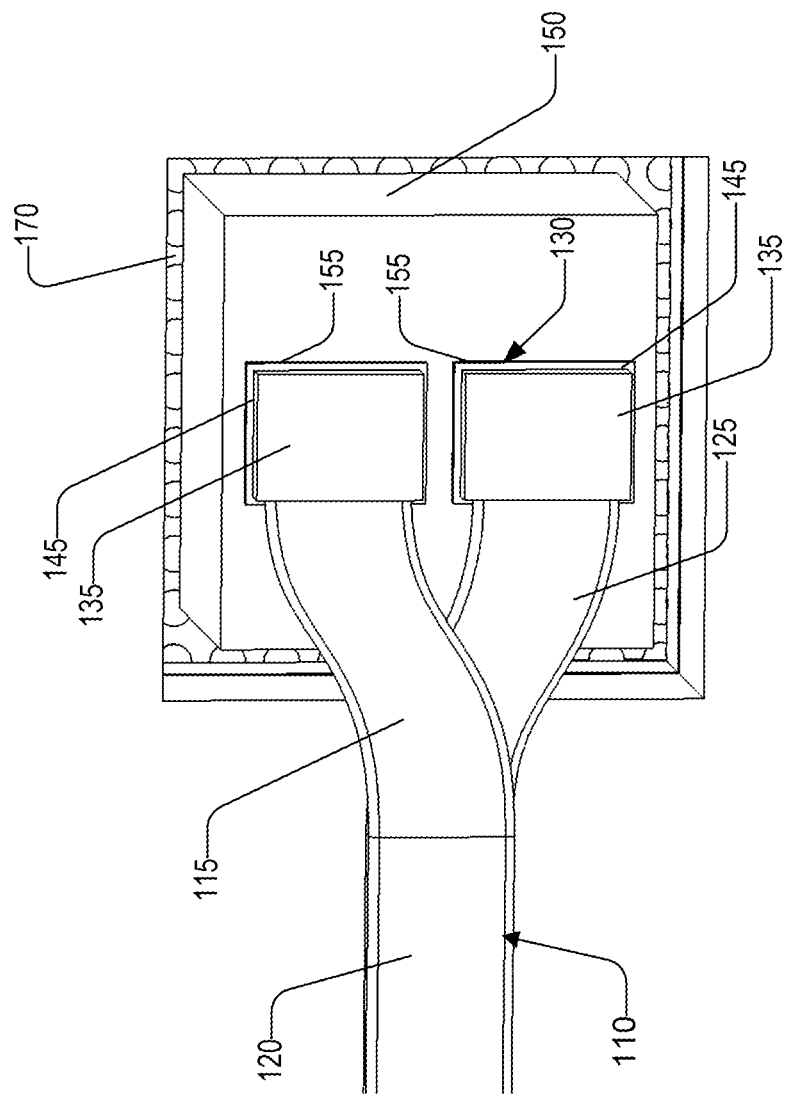
FIG. 4 is a bottom perspective view of a cable connector module connected to a semiconductor package, consistent with an illustrative embodiment.
Figure 5:
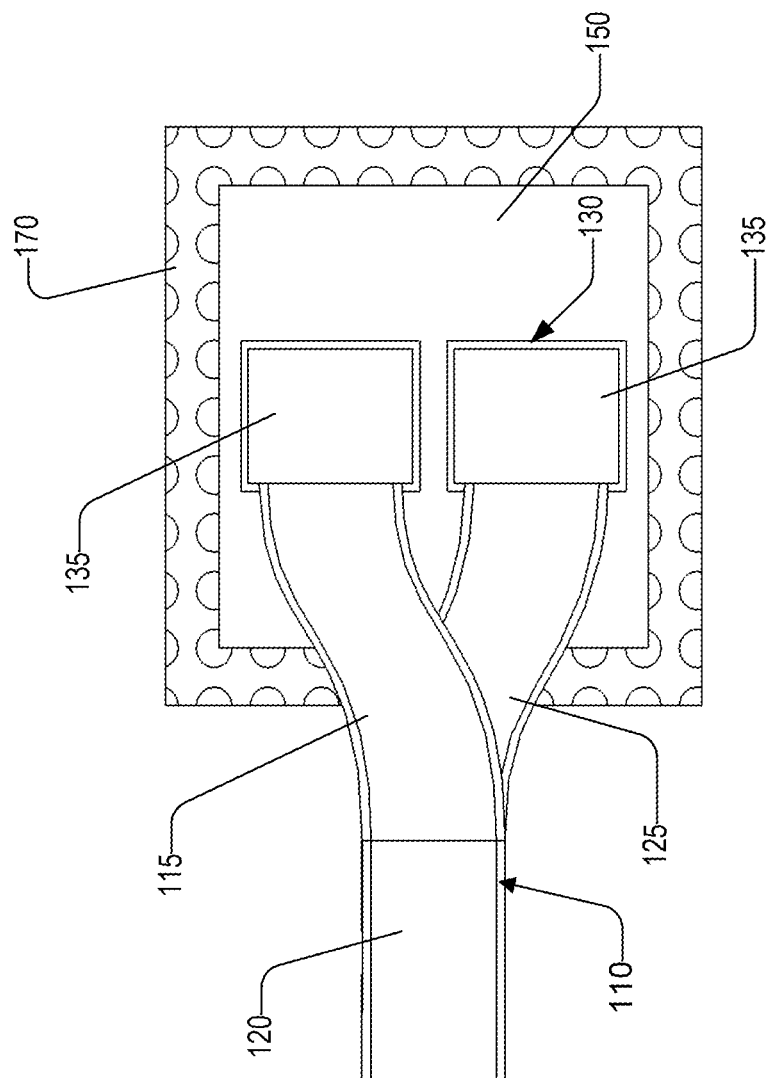
FIG. 5 is a bottom view of the cable connector module of FIG. 4, consistent with an illustrative embodiment.

Referring now to FIGS. 4 and 5, an overhead view of the cable 120 is shown. The width of the cable 120 may be approximately 20 mm. Some embodiments of the cable 120 may split apart at the end of the cable leading into the connector module 130. In an illustrative embodiment, the connector module 130 may include adhesive patch pads 135; one for input line 115 and one for output line 125. The dimensions of the adhesive patch pads 135 may be for example, 30 mm long, 20 mm wide, and 2 mm tall. Accordingly, the width to thickness ratio is at least 10:1 in embodiments. The length to thickness ratio is 15:1. As will be appreciated, the connector module 130 has a low-profile since the height (thickness) is much smaller than the length or width. The width may vary depending on whether there is one adhesive patch pad 135 or two adhesive patch pads 135. The low profile of the connector module 130 allows the connector device 110 enter and exit the clearance space above structure 99 laterally relative to the primary surface (for example, top surface of motherboard 140) of the semi-conductor package 100.

The adhesive patch pad(s) 135 may include a layer 145 of conductive glue. The adhesive patch pads 135 may detachably connect to a conductive pad 155 on a bottom side of the voltage regulator 150.

In operation, the connector device 110 may be fed into the clearance space under the motherboard 140 until the connector module 130 is under the connection pad 155 of the voltage regulator 150. While there are numerous ways of attaching the connector device 110, an illustrative example uses non-conductive slim tools to guide and direct the connector module 130 into alignment with the voltage regulator 150. The technician may press the adhesive patch pads 135 onto the bottom side of the voltage regulator 150 using the tool until the connector module 130 is firmly attached. For detachment, the technician may use the tool to pry the connector module 130 from the voltage regulator 150.

Conclusion

The subject device 110 provides high DC voltage from an upstream converter to a DC-DC voltage regulator that is packaged underneath a processor module or motherboard. The device's structure makes the input power delivery for future high-power processors practical, as voltage requirements increase. As will be appreciated, the input power connection is moved out of the traditional card trace connection scheme on the top surface of the board or out of the module substrate wiring escape region. As is known, high voltage connection schemes have a wide keep out area in the card and substrate. The connection structure through the underside of the board helps to avoid using card traces and substrate traces for high voltage connections. In addition, the device 110 completely separates the signal region and the power wiring connection region. The cable 120 is isolated from the board and the LGA package, so that the device 110 complies with keep out requirements on the board. Accordingly, signal interference and parasitic losses are minimized. As also previously mentioned, by avoiding a connection to the top side of the motherboard or mezzanine card, the proposed connector device 110 saves valuable space. In yet another aspect, the device 110 provides the advantages of separable and reworkable connections to the semi-conductor package 100 through a tight working space.

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A connector device, comprising:
   a cable configured to conduct power from an upstream source; and
   a low-profile connector module attached to an end of the cable, wherein:
   the low-profile connector module is configured to interface to a bottom side of a voltage regulator,
   a top side of the voltage regulator is mounted to a semiconductor package,
   the cable further comprises a power in line and a power out line, and
   the connector module further comprises a first electrically conductive adhesive patch for attaching the power in line to the bottom side of the voltage regulator and a second electrically conductive adhesive patch for attaching the power out line to the bottom side of the voltage regulator.

2. The device of claim 1, wherein the connector module further comprises an electrically conductive adhesive patch for attaching the connector module to the bottom side of the voltage regulator.

3. The device of claim 1, wherein the connector module is configured for detachable connection to the bottom side of the voltage regulator.

4. The device of claim 1, wherein a width to thickness ratio or a length to thickness ratio of the connector module is at least 10:1.

5. The device of claim 1, wherein a power level of the upstream source conducted by the cable is at least 100 watts or more.

6. The device of claim 1, wherein a clearance space between the voltage regulator and a device surface under the voltage regulator is less than 20 mm wide and the connector module is configured to fit within the clearance space.

7. The device of claim 1, wherein the power is a direct current (DC) voltage and the upstream source is a DC converter.

8. A connector device, comprising:
a cable configured to conduct power from an upstream source; and
a low-profile connector module attached to an end of the cable, wherein:
the low-profile connector module is configured to interface to a bottom side of a voltage regulator,
a top side of the voltage regulator is mounted to a semiconductor package,
the semiconductor package includes a motherboard, and
the voltage regulator is coupled to a processor die through a hole in the motherboard, under the processor die.

9. The device of claim 1, wherein the semiconductor package includes a mezzanine card and the voltage regulator is coupled to a component on the mezzanine card through a hole in the mezzanine card.

10. A connector device, comprising: a cable configured to conduct a voltage from an upstream power converter source; a low-profile connector module attached to an end of the cable; and an electrically conductive adhesive patch mounted to the low-profile connector module, wherein: the low-profile connector module is configured to interface to a bottom side of a voltage regulator; a top side of the voltage regulator is mounted to a semiconductor package; the adhesive patch mounted to the low-profile connector module includes a first electrically conductive patch and a second electrically conductive patch, both are configured to interface to the bottom side of the voltage regulator and conduct the voltage from the power converter into the voltage regulator.

11. The device of claim 10, wherein the connector module is configured for a detachable connection to the bottom side of the voltage regulator.

12. The device of claim 10, wherein the cable further comprises a power in line and a power out line.

13. The device of claim 10, wherein a width to thickness ratio or a length to thickness ratio of the connector module is at least 10:1.

14. The device of claim 10, wherein a power level of the upstream DC converter source conducted by the cable is at least 100 watts or more.

15. A semiconductor package, comprising:
a computer processor die;
a substrate, wherein the computer processor die is mounted on to a top surface of the substrate;
a printed circuit board, wherein the substrate is mounted on to the printed circuit board;
a voltage regulator coupled to the printed circuit board, wherein a top surface of the voltage regulator is coupled to a bottom surface of the substrate; and
a connector device, comprising:
a cable configured to conduct power from an upstream source; and
a low-profile connector module attached to an end of the cable, wherein the low-profile connector module is configured to interface to a bottom surface of the voltage regulator.

16. The semiconductor package of claim 15, wherein the connector module further comprises an electrically conductive adhesive patch for attaching the connector module to the bottom side of the voltage regulator.

17. The semiconductor package of claim 15, wherein the connector module is configured for detachable connection to the bottom side of the voltage regulator.

18. The semiconductor package of claim 15, wherein the power is a direct current (DC) voltage and the upstream source is a DC converter.

* * * * *